(12) United States Patent
Kunishima et al.

(10) Patent No.: US 7,763,968 B2
(45) Date of Patent: Jul. 27, 2010

(54) SEMICONDUCTOR DEVICE FEATURING LARGE REINFORCING ELEMENTS IN PAD AREA

(75) Inventors: Hiroyuki Kunishima, Kanagawa (JP); Noriaki Oda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 722 days.

(21) Appl. No.: 11/526,572

(22) Filed: Sep. 26, 2006

(65) Prior Publication Data
US 2007/0069388 A1    Mar. 29, 2007

(30) Foreign Application Priority Data
Sep. 26, 2005 (JP) ............................. 2005-277721

(51) Int. Cl.
*H01L 23/12* (2006.01)
*H01L 21/4763* (2006.01)

(52) U.S. Cl. .................. 257/700; 257/758; 257/774; 438/622; 438/624; 438/629

(58) Field of Classification Search .................. None
See application file for complete search history.

(56) References Cited

U.S. PATENT DOCUMENTS

2001/0034117 A1* 10/2001 Eldridge et al. ............. 438/619
2003/0003703 A1* 1/2003 Barth et al. ................. 438/601
2005/0146042 A1* 7/2005 Yamaha ...................... 257/758
2005/0167842 A1* 8/2005 Nakamura et al. .......... 257/758
2005/0173806 A1* 8/2005 Matsubara .................. 257/774

FOREIGN PATENT DOCUMENTS

| JP | 10-335333 | 12/1998 |
|---|---|---|
| JP | 2001-267323 | 9/2001 |
| JP | 2004-039951 | 2/2004 |
| JP | 2004-135416 | 8/2004 |
| JP | 2004-282071 | 10/2004 |

* cited by examiner

*Primary Examiner*—Alonzo Chambliss
(74) *Attorney, Agent, or Firm*—Young & Thompson

(57) ABSTRACT

In a semiconductor device, a plurality of interconnections are formed in an interconnection formation insulating interlayer, and a plurality of reinforcing elements are substantially evenly formed in blank areas of the interconnection insulating interlayer in which no interconnection is formed. A wire-bonding electrode pad is provided above the interconnection formation insulating interlayer so that a pad area, on which the wire-bonding electrode pad is projected, is defined on the interconnection formation insulating interlayer. A part of the reinforcing elements included in the pad area features a larger size than that of the remaining reinforcing elements.

13 Claims, 13 Drawing Sheets

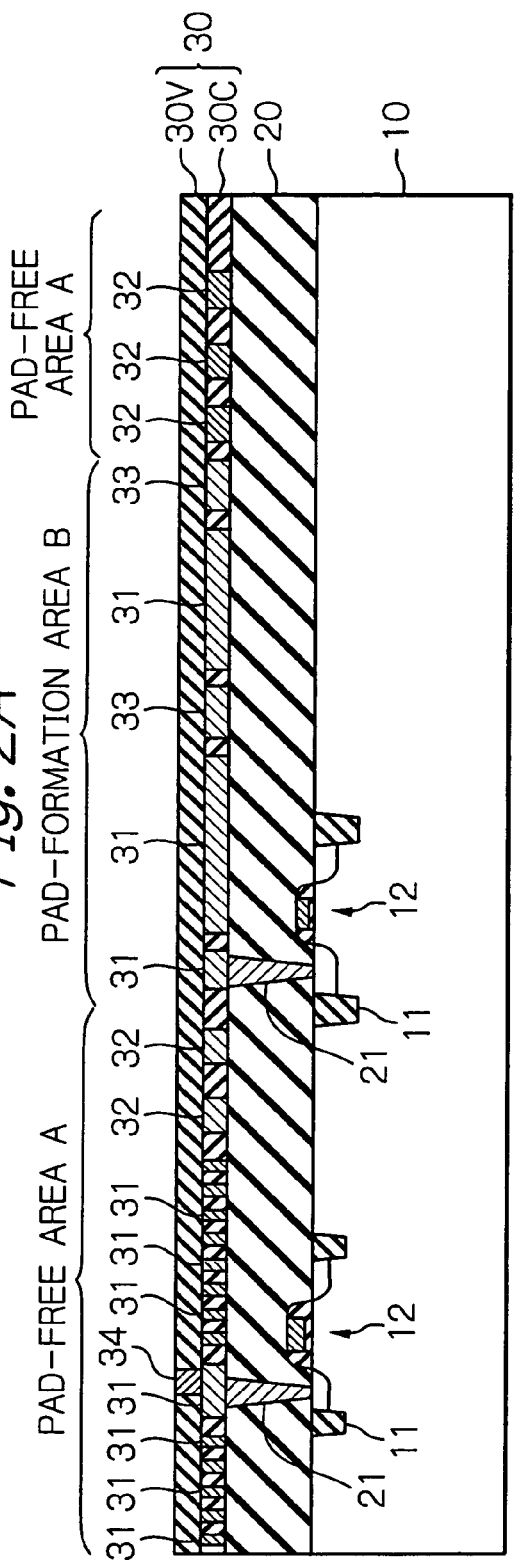
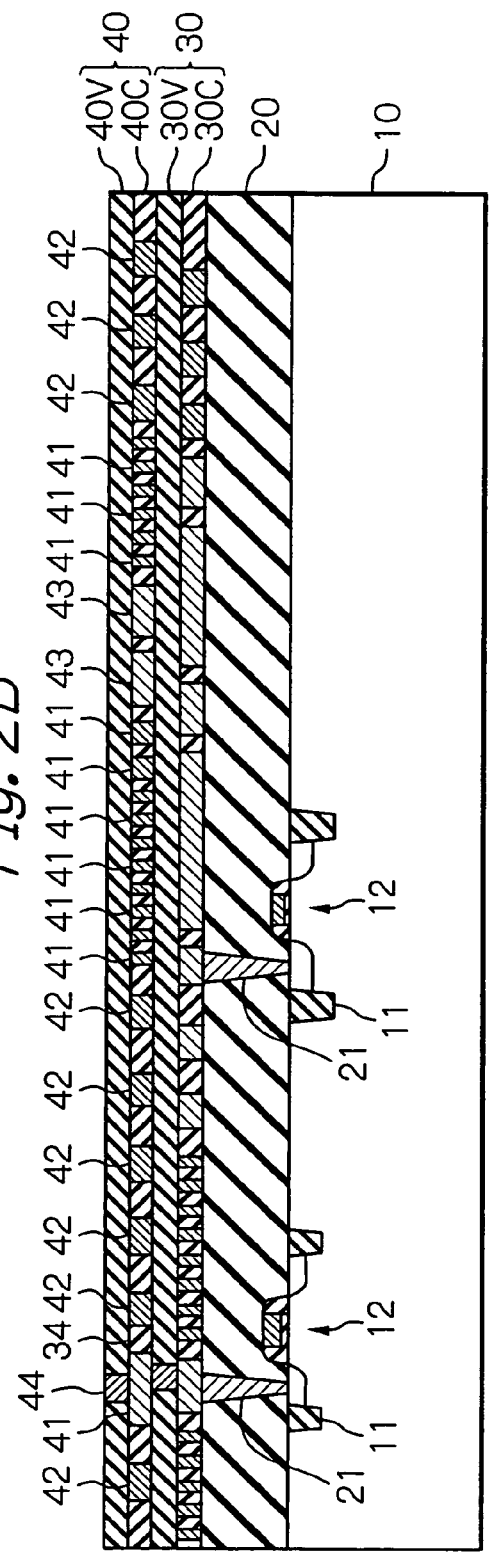

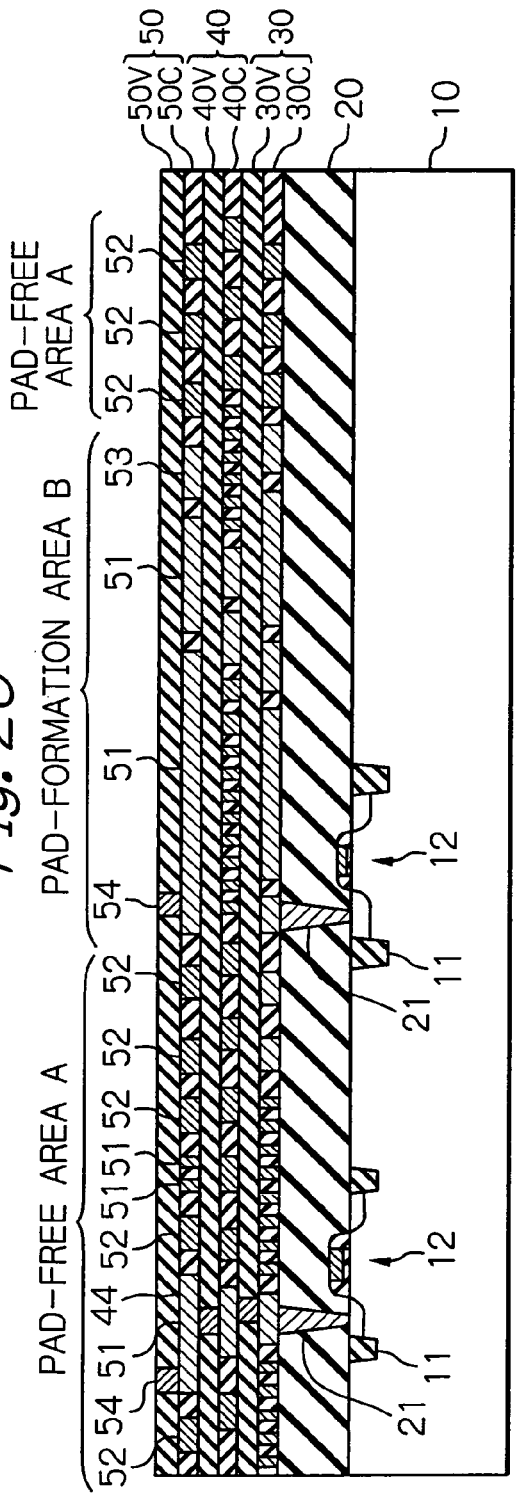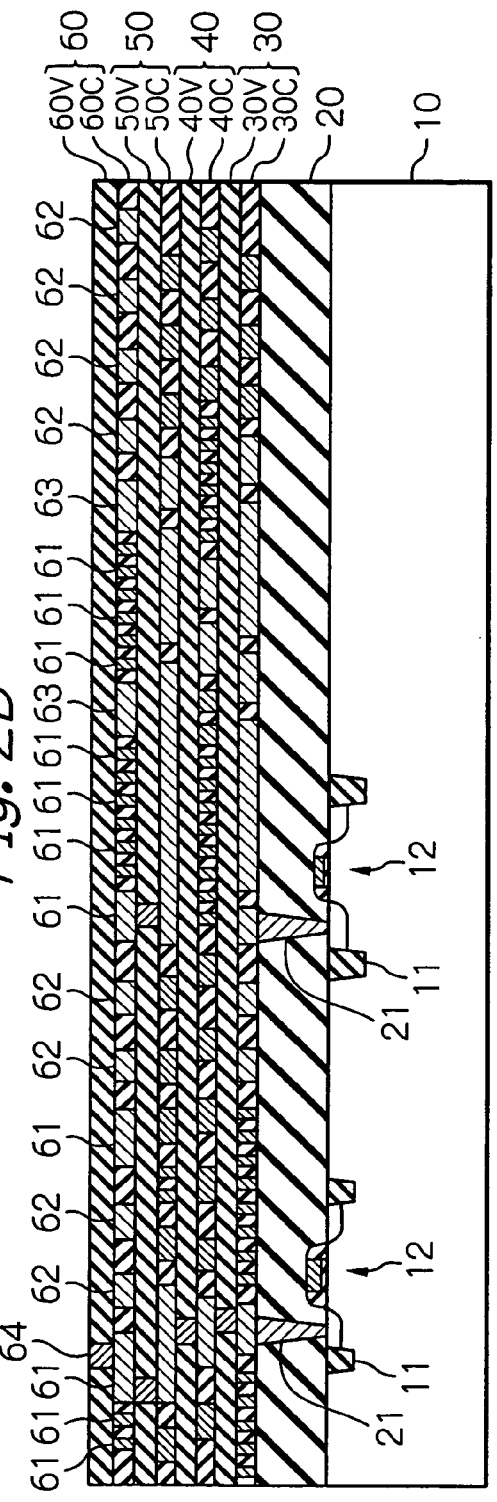

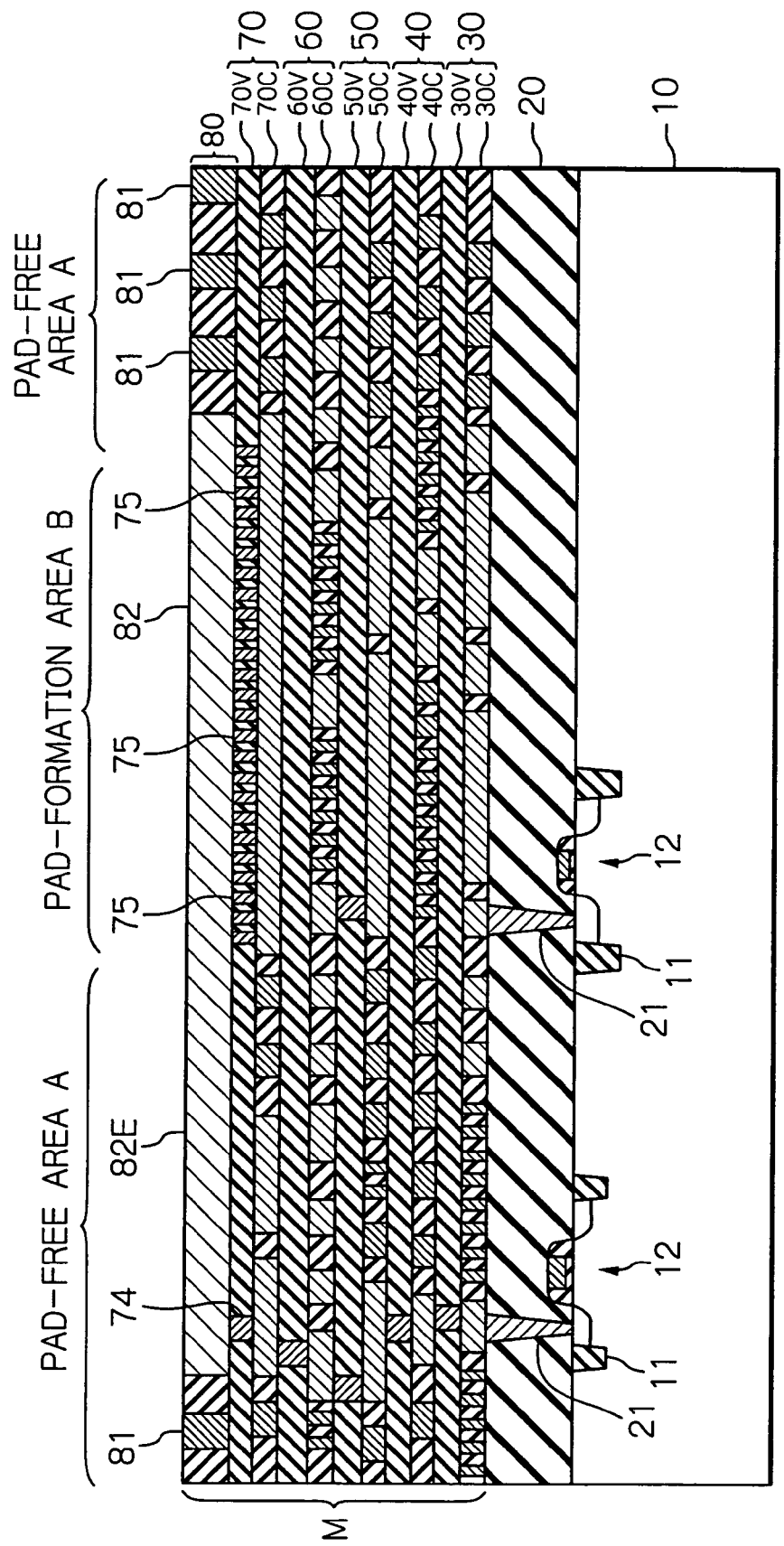

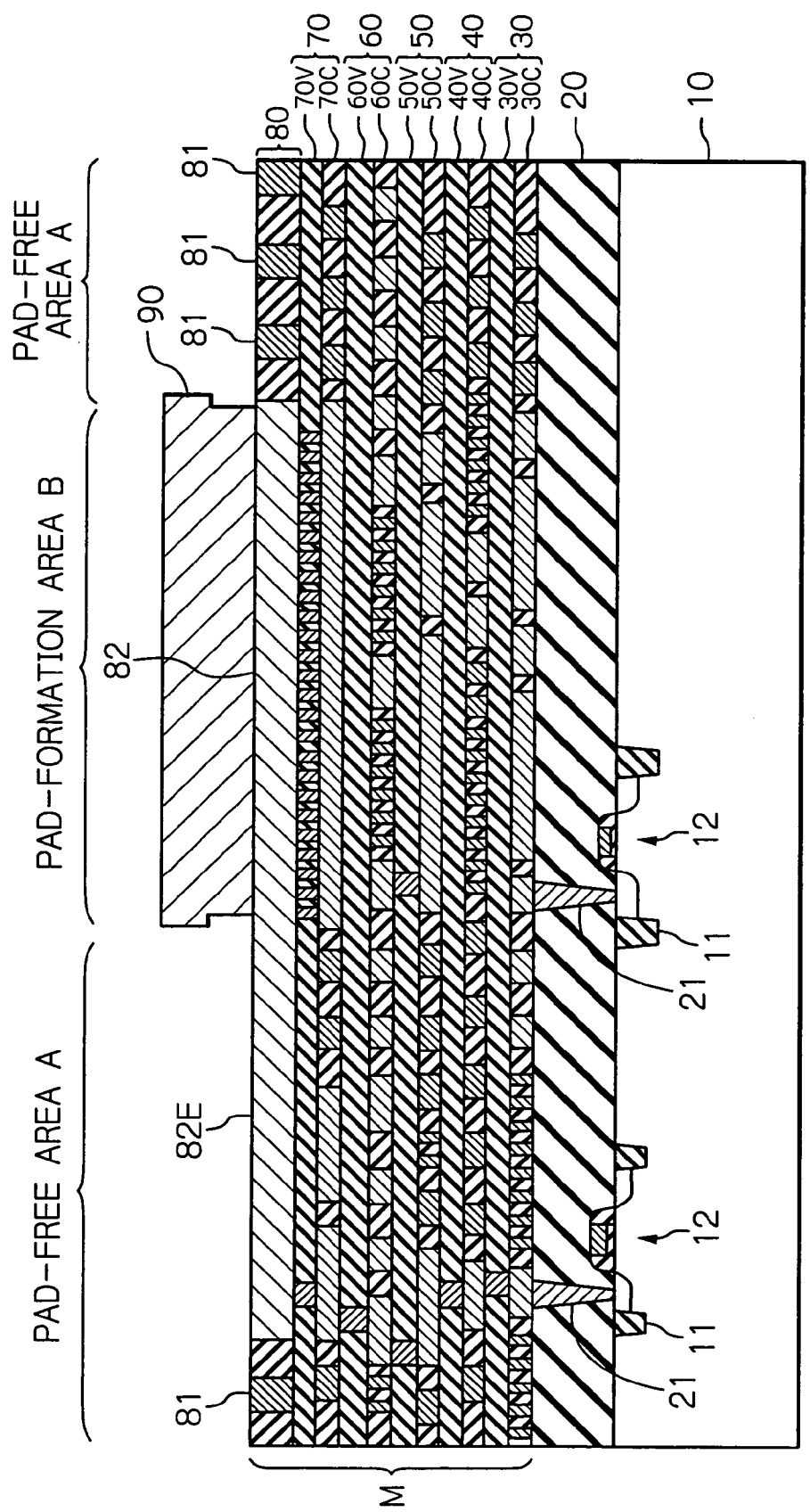

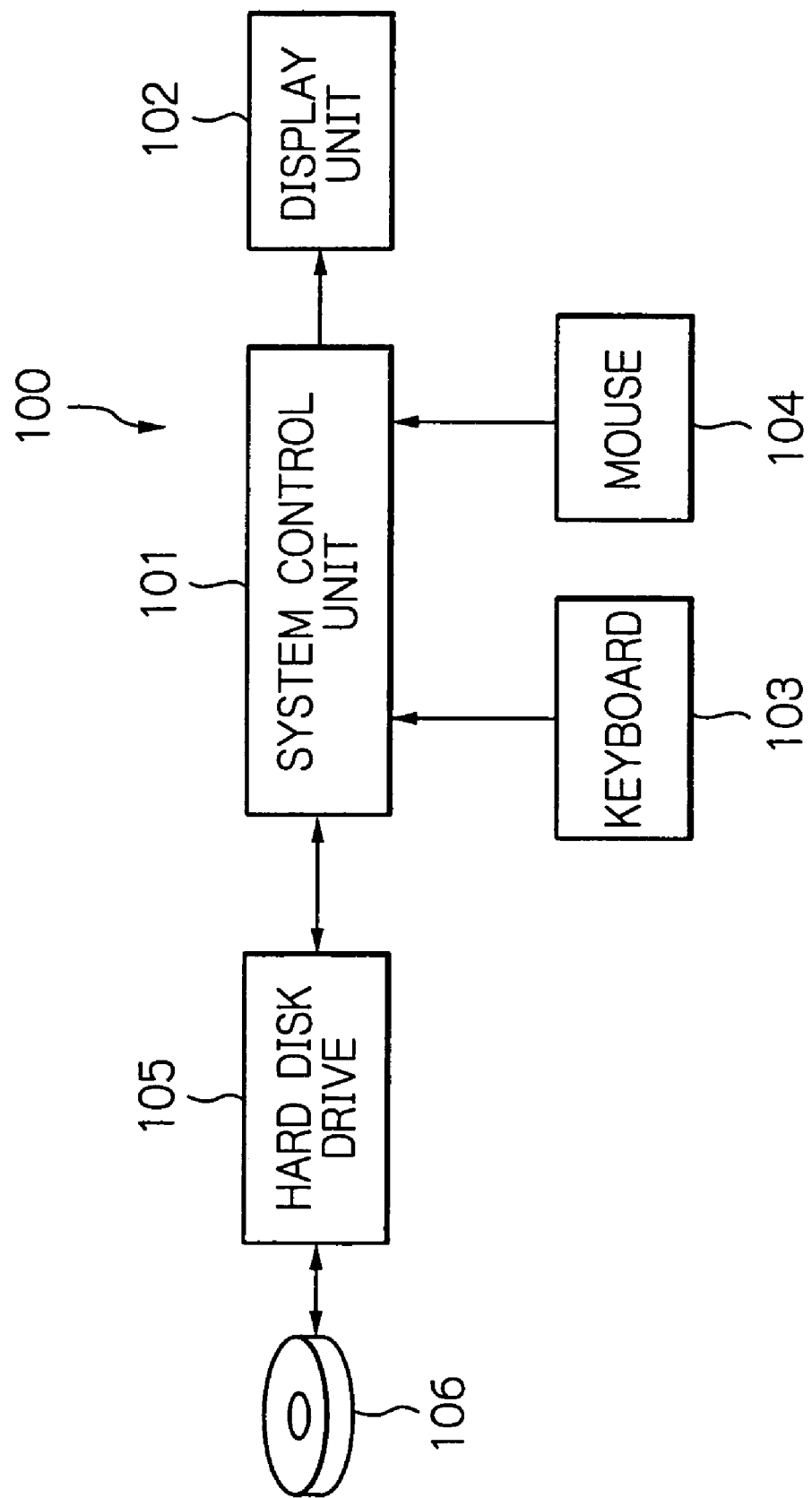

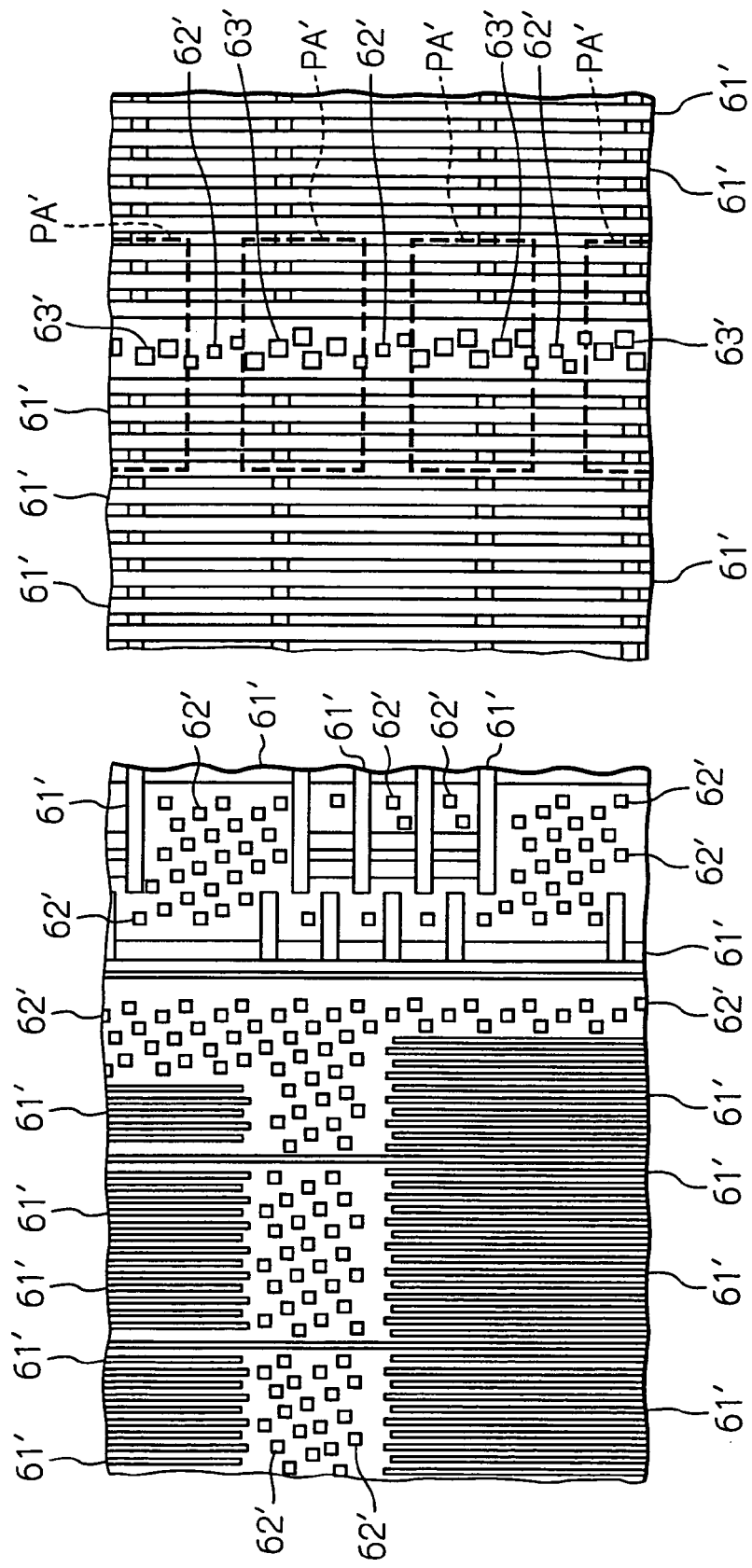

SEMICONDUCTOR DEVICE FEATURING LARGE REINFORCING ELEMENTS IN PAD AREA

BACKGROUND OF THE INVENTION

1. Field of the Invention

The present invention relates to a semiconductor device featuring a plurality of wire-bonding pads, an interconnection pattern layer and a reinforcement pattern layer, and also relates to a pattern design apparatus for designing such both an interconnection pattern and a reinforcement pattern therefor.

2. Description of the Related Art

Usually, a semiconductor device has a multi-layered interconnection structure including a plurality of interconnection substructures, and each of the interconnection substructures has an interconnection formation insulating interlayer in which an interconnection pattern layer including a plurality of interconnections is formed, and a via-plug formation insulating interlayer in which a via-plug pattern layer including a plurality of via plugs is formed, with the interconnection pattern layers formed in the two adjacent interconnection formation insulating interlayers being suitably connected to each other through the intermediary of the plugs formed in the via-plug formation insulating interlayer therebetween.

The multi-layered interconnection structure includes an uppermost interconnection substructure having a plurality of wire-bonding electrode pads formed on a top surface thereof, and the wire-bonding electrode pads are suitably connected to the interconnection pattern layers included in the multi-layered interconnection structure. When the semiconductor device is mounted on a wiring board, each of the wire-bonding electrode pads is connected to an external electrode pad with a bonding wire, using a suitable wire bonding machine.

Conventionally, each of the insulating interlayers is formed as a silicon dioxide layer, and the interconnections and the via plugs are composed of aluminum.

With the recent advance of miniaturization and integration of semiconductor devices, the multi-layered interconnection structure becomes smaller, and thus the interconnections for signal transmission become thinner, resulting in delay of signal propagation in the interconnections, due to parasitic resistance of the signal transmission interconnections and parasitic capacitance involved in the signal transmission interconnections. In short, the miniaturization of the semiconductor devices has advanced to a degree in which a magnitude of a dielectric constant of the silicon dioxide layer and a magnitude of a resistance of the aluminum interconnections cannot be neglected.

Thus, there is a recent trend toward use of copper, exhibiting a smaller specific resistance than that of aluminum, for the interconnections, whereby it is possible to facilitate the signal transmission in the interconnections. Also, it has been proposed that an insulating interlayer, composed of a low-k material having a smaller dielectric constant than that of silicon dioxide, be substituted for the silicon dioxide layer, to thereby suppress the production of the parasitic capacitance. Note, for the low-k material, SiOC, SiC, SiOF, porous $SiO_2$, porous SiOC or the like may be used.

Nevertheless, the low-k insulating interlayer exhibits an inferior physical strength to that of the silicon dioxide layer. Thus, the low-k insulating interlayer is susceptible to damage due to an impact which is produced when a bonding wire is bonded to each of the wire-bonding electrode pads by a wire-bonding machine.

In JP-2004-235416 A, it has been proposed that copper reinforcing elements are formed in a low-k insulating interlayer beneath a wire-bonding electrode pad so that the low-k insulating interlayer can be protected from being damaged when a bonding wire is bonded to the wire-bonding electrode pad by the wire-bonding machine.

Also, in JP-2004-039951 A, it has been proposed that both an interconnection pattern layer and a reinforcement pattern layer are formed in a low-k insulating interlayer so that the low-k insulating interlayer is wholly reinforced. In particular, the interconnection pattern layer includes a plurality of interconnections, and these interconnections are unevenly arranged and distributed over the low-k insulating interlayer so that blank areas, in which no interconnection is formed, are defined on the low-k insulating interlayer. On the other hand, the reinforcement pattern layer includes a plurality of reinforcing elements, and these reinforcing elements are arranged and distributed over the blank areas, whereby the low-k insulating interlayer is wholly reinforced.

SUMMARY OF THE INVENTION

It has now been discovered that the above-mentioned prior art semiconductor device has a problem to be solved as mentioned hereinbelow.

Since there is a demand for higher speed in signal propagation, a dielectric constant of the low-k insulating interlayer becomes even smaller. The smaller the dielectric constant, the smaller the physical strength of the low-k insulating interlayer. Accordingly, the reinforcing elements should have as large size as possible, before the low-k insulating interlayer can be sufficiently reinforced. However, when the size of the reinforcing elements is too large, the optimum conditions of an etching process for forming the interconnections and the reinforcing elements in the low-k insulating interlayer may fluctuate.

In particular, there may be a case where an amount of reinforcing elements to be formed in an insulating interlayer is considerably larger than that of reinforcing elements to be formed in another insulating interlayer. In this case, when the size of the reinforcing elements is too large, an amount of etching gas used in the etching process for forming the reinforcing elements in the former insulating interlayer are considerably larger than that of etching gas used in the etching process for forming the reinforcing elements in the latter insulating interlayer. In short, the fluctuation of the optimum conditions of the etching processes should be suppressed before the manufacturing of semiconductor devices can be effectively carried out.

In accordance with a first aspect of the present invention, there is provided a semiconductor device comprising a wire-bonding electrode pad, a plurality of interconnections, a first set of reinforcing elements provided beneath the wire-bonding electrode pad, and a second set of reinforcing elements provided among the interconnections. The first set of reinforcing elements have a larger size than that of the second set of reinforcing elements.

Preferably, the semiconductor device further comprises an insulating layer in which the first set of reinforcing elements and the second set of reinforcing elements are formed. Also, the interconnections may be further formed in the insulating interlayer.

Preferably, the second set of reinforcing elements are formed in the insulating layer except for a pad area above which the wire-bonding electrode pad is provided.

At least one of the interconnections may be arranged beneath the wire-bonding electrode pad. In this case, preferably, the at least one of the interconnections is defined as one of a power supply interconnection and a ground interconnection.

Preferably, the wire-bonding electrode pad is electrically isolated from the first set of reinforcing elements.

Preferably, the wire-bonding electrode pad is composed of aluminum as a main component, and the interconnections, the first set of reinforcing elements and the second set of reinforcing elements are composed of copper as respective main components.

In accordance with a second aspect of the present invention, there is provided a semiconductor device comprising an interconnection formation insulating interlayer, a plurality of interconnections formed in the interconnection formation insulating interlayer, a plurality of reinforcing elements substantially evenly formed in blank areas of the interconnection insulating interlayer in which no interconnection is formed, and a wire-bonding electrode pad provided above the interconnection formation insulating interlayer so that a pad area, on which the wire-bonding electrode pad is projected, is defined on the interconnection formation insulating interlayer. A part of the reinforcing elements included in the pad area features a larger size than that of the remaining reinforcing elements.

In the second aspect of the present invention, preferably, the interconnection formation insulating interlayer is defined as an insulating interlayer exhibiting a smaller dielectric constant than that of silicon dioxide. In this case, the wire-bonding electrode pad may be composed of aluminum, and the interconnections and the reinforcing elements may be composed of copper.

Also, in the second aspect of the present invention, at least one of the interconnections may be arranged so as to extend through the pad area. In this case, preferably, the at least one of the interconnections is defined as one of a power supply interconnection and a ground interconnection.

In accordance with a third aspect of the present invention, there is provided a pattern design apparatus that carries out a design of both an interconnection pattern and a reinforcement pattern to be formed in an interconnection formation insulating interlayer. In the pattern design apparatus, an interconnection pattern calculating unit calculates an interconnection pattern including a plurality of interconnections, and a reinforcement pattern calculating unit calculates a reinforcement pattern including a plurality of evenly distributed reinforcing elements. Also, a reinforcement pattern deforming unit deforms the reinforcement pattern so as to eliminate a part of the reinforcing elements, which overlaps with at least one of the interconnections, and another part of the reinforcing elements, which is too close to at least one of the interconnections, and a reinforcing-element enlarging unit enlarges a part of the reinforcing elements, which is included in a pad area above which a wire-bonding electrode pad is provided, as large reinforcing elements.

BRIEF DESCRIPTION OF THE DRAWINGS

The present invention will be more clearly understood from the description set forth below, with reference to the accompanying drawings, wherein:

FIGS. 2A through 2G are schematic partial cross-sectional views showing a method for manufacturing the semiconductor device of FIG. 1;

FIG. 4 is a schematic block diagram of an interconnection/reinforcement pattern design apparatus according to the present invention;

FIGS. 9A and 9B are explanatory views corresponding to FIGS. 3A and 3B for explaining step 509 of FIG. 5.

DESCRIPTION OF THE PREFERRED EMBODIMENT

Figure 1:
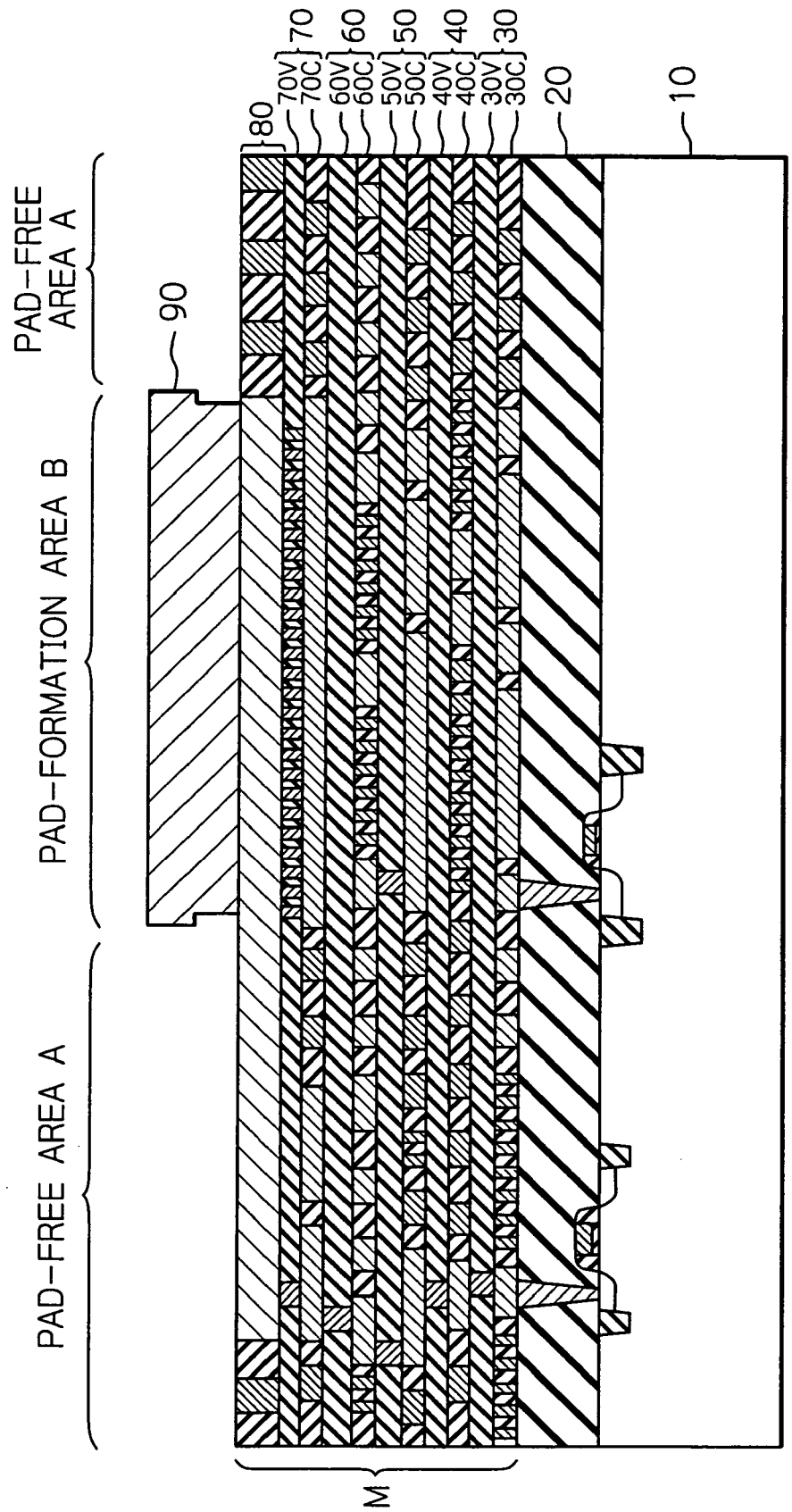
FIG. 1 is a schematic partial cross-sectional view showing an embodiment of the semiconductor device according to the present invention.

With reference to FIG. 1 which is a schematic partial cross-sectional view, an embodiment of a semiconductor device according to the present invention will be explained below.

As illustrated, the semiconductor device includes a semiconductor substrate 10, an insulating underlayer or contact layer 20 formed on the semiconductor substrate 10, and a multi-layered interconnection structure M formed on the contact layer 20 and including six interconnection substructures 30, 40, 50, 60, 70 and 80 stacked in order.

Each of the interconnection substructures 30, 40, 50, 60 and 70 has an interconnection formation insulating interlayer 30C, 40C, 50C, 60C or 70C in which a plurality of interconnections are formed, and a via-plug formation insulating interlayer 30V, 40V, 50V, 60V or 70V in which a plurality of via-plugs are formed. Each of the insulating interlayers is defined as a suitable low-k layer, such as an SiOC layer, an SiC layer, an SiOF layer, a porous $SiO_2$ layer, a porous SiOC layer or the like.

The interconnection substructure 80 is provided on the interconnection substructure 70 as a single interconnection formation insulating layer which may be defined as a silicon dioxide layer. Although a plurality of electrode pads are formed on the single interconnection formation insulating layer 80, only one of the electrode pads, indicated by reference numeral 90, is representatively illustrated.

In the semiconductor device of FIG. 1, a pad-free area A, in which no electrode pad is included, and a pad formation area B, in which the electrode pad 90 is included, are defined for the sake of convenience of explanation.

Next, with reference to FIGS. 2A through 2G, a method for manufacturing the semiconductor device of FIG. 1 is explained below.

First, referring to FIG. 2A which is a schematic partial cross-sectional view, a semiconductor substrate 10, which may be derived from a silicon wafer, is prepared, and a plurality of element-isolation layers 11 are formed in the semiconductor substrate 10, using a shallow trench isolation (STI) process. In FIG. 2A, only two of the element-isolation layers 11 are representatively illustrated by way of example. For example, a metal oxide semiconductor (MOS) transistor 12 is formed in an isolated area defined by each of the illustrated element-isolation layers 11 by using a well-known variety of processes, such as such as a photolithography and etching process, a chemical vapor deposition (CVD) process, a sputtering process and so on. Although not shown in FIG. 2A, various electronic elements, such as other transistors, resistors, capacitors and so on, may be formed in areas surrounded by the not-illustrated element-isolation layers.

After the formation of the various elements in the semiconductor substrate 10 is completed, an insulating underlayer or contact layer 20 is formed as a silicon dioxide layer on the semiconductor substrate 10 by using a CVD process. The contact layer 20 has a plurality of contact plugs 21 formed therein, only two of which are illustrated by way of example, and the formation of the contact plugs 21 is carried out by a photolithography and etching process, a sputtering process and so on. Each of the contact plugs 21 is connected to a drain/source region of the corresponding MOS transistor 12. Note, the contact plugs 21 may be composed of a suitable metal, aluminum (Al), tungsten (W) or the like.

Then, an interconnection substructure 30 having an interconnection formation insulating interlayer 30C and a via-plug formation insulating interlayer 30V is provided on the contact layer 20.

In particular, first, the insulating interlayer 30C is formed as a low-k layer on the contact layer 20 by using a CVD process, and an interconnection pattern layer including a plurality of interconnections 31 is formed in the insulating interlayer 30C. Also, in order to reinforce the insulating interlayer 30C, a reinforcement pattern layer including a plurality of reinforcing elements 32 and 33 is formed in the insulating interlayer 30C. The interconnections 31 and the reinforcing elements 32 and 33 are composed of copper (Cu), and the formation of the interconnections 31 and the formation of the reinforcing elements 32 and 33 may be simultaneously carried out by using a damascene process which involves a photolithography and etching process, a copper electroplating process, a chemical mechanical polishing (CMP) process, an annealing process and so on.

As shown in FIG. 2A, two of the interconnections 31 are connected to the contact plugs 21.

Also, as shown in FIG. 2A, the reinforcing elements 33 included in the pad formation area B feature a larger size than that of the reinforcing elements 32 included in the pad-free area A.

Then, the insulating interlayer 30V is formed as a low-k layer on the insulating interlayer 30C by using a CVD process, and a via-plug pattern layer including a plurality of via plugs 34, only one of which is representatively illustrated, is formed in the insulating interlayer 30V. The via plugs 34 are composed of copper (Cu), and the formation of the plugs 34 is carried out by using a damascene process.

As shown in FIG. 2A, each of the via plugs 34 is connected to one of the interconnections 31 formed in the insulating interlayer 30C.

Next, referring to FIG. 2B which is a schematic partial cross-sectional view, an interconnection substructure 40 having an interconnection formation insulating interlayer 40C and a via-plug formation insulating interlayer 40V is provided on the interconnection substructure 30.

In particular, the insulating interlayer 40C is formed as a low-k layer on the insulating interlayer 30V, using a CVD process, and an interconnection pattern layer including a plurality of interconnections 41 is formed in the insulating interlayer 40C. Also, in order to reinforce the insulating interlayer 40C, a reinforcement pattern layer including a plurality of reinforcing elements 42 and 43 is formed in the insulating interlayer 40C. The interconnections 41 and the reinforcing elements 42 and 43 are composed of copper (Cu), and the formation of the interconnections 41 and the formation of the reinforcing elements 42 and 43 may be simultaneously carried out by using a damascene process.

As shown in FIG. 2B, one of the interconnections 41, is connected to each of the via plugs 34 formed in the insulating interlayer 30V.

Also, as shown in FIG. 2B, the reinforcing elements 43 included in the pad formation area B feature a larger size than that of the reinforcing elements 42 included in the pad-free area A.

Then, the insulating interlayer 40V is formed as a low-k layer on the insulating interlayer 40C by using a CVD process, and a via-plug pattern layer including a plurality of via plugs 44, only one of which is representatively illustrated, is formed in the insulating interlayer 40V. The via plugs 44 are composed of copper (Cu), and the formation of the plugs 44 is carried out by using a damascene process.

As shown in FIG. 2B, each of the via plugs 44 is connected to one of the interconnections 41 formed in the insulating interlayer 40C.

Next, referring to FIG. 2C which is a schematic partial cross-sectional view, an interconnection substructure 50 having an interconnection formation insulating interlayer 50C and a via-plug formation insulating interlayer 50V is provided on the interconnection substructure 40.

In particular, the insulating interlayer 50C is formed as a low-k layer on the insulating interlayer 40V, using a CVD process, and an interconnection pattern layer including a plurality of interconnections 51 is formed in the insulating interlayer 50C. Also, in order to reinforce the insulating interlayer 50C, a reinforcement pattern layer including a plurality of reinforcing elements 52 and 53 is formed in the insulating interlayer 50C. The interconnections 51 and the reinforcing elements 52 and 53 are composed of copper (Cu), and the formation of the interconnections 51 and the formation of the reinforcing elements 52 and 53 may be simultaneously carried out by using a damascene process.

As shown in FIG. 2C, each of the interconnections 51 is connected to one of the via plugs 44 formed in the insulating interlayer 40V.

Also, as shown in FIG. 2C, the reinforcing elements 53 included in the pad formation area B feature a larger size than that of the reinforcing elements 52 included in the pad-free area A.

Then, the insulating interlayer 50V is formed as a low-k layer on the insulating interlayer 50C by using a CVD process, and a via-plug pattern layer including a plurality of via plugs 54, only two of which are representatively illustrated, is formed in the insulating interlayer 50V. The via plugs 54 are composed of copper (Cu), and the formation of the plugs 54 is carried out by using a damascene process.

As shown in FIG. 2C, the via plugs 54 are respectively connected to two of the interconnections 51 formed in the insulating interlayer 50C.

Next, referring to FIG. 2D which is a schematic partial cross-sectional view, an interconnection substructure 60 having an interconnection formation insulating interlayer 60C and a via-plug formation insulating interlayer 60V is provided on the interconnection substructure 50.

In particular, the insulating interlayer 60C is formed as a low-k layer on the insulating interlayer 50V, using a CVD process, and an interconnection pattern layer including a plurality of interconnections 61 is formed in the insulating interlayer 60C. Also, in order to reinforce the insulating interlayer 60C, a reinforcement pattern layer including a plurality of reinforcing elements 62 and 63 is formed in the insulating interlayer 60C. The interconnections 61 and the reinforcing elements 62 and 63 are composed of copper (Cu), and the formation of the interconnections 61 and the formation of the reinforcing elements 62 and 63 may be simultaneously carried out by using a damascene process.

As shown in FIG. 2D, two of the interconnections 61 are respectively connected to the via plugs 54 formed in the insulating interlayer 50V.

Also, as shown in FIG. 2D, the reinforcing elements 63 included in the pad formation area B feature a larger size than that of the reinforcing elements 62 included in the pad-free area A.

Then, the insulating interlayer 60V is formed as a low-k layer on the insulating interlayer 60C by using a CVD process, and a via-plug pattern layer including a plurality of via plugs 64, only one of which is representatively illustrated, is formed in the insulating interlayer 60V. The via plugs 64 are composed of copper (Cu), and the formation of the plugs 64 is carried out by using a damascene process.

As shown in FIG. 2D, each of the via plugs 64 is connected to one of the interconnections 61 formed in the insulating interlayer 60C.

Figure 2E:
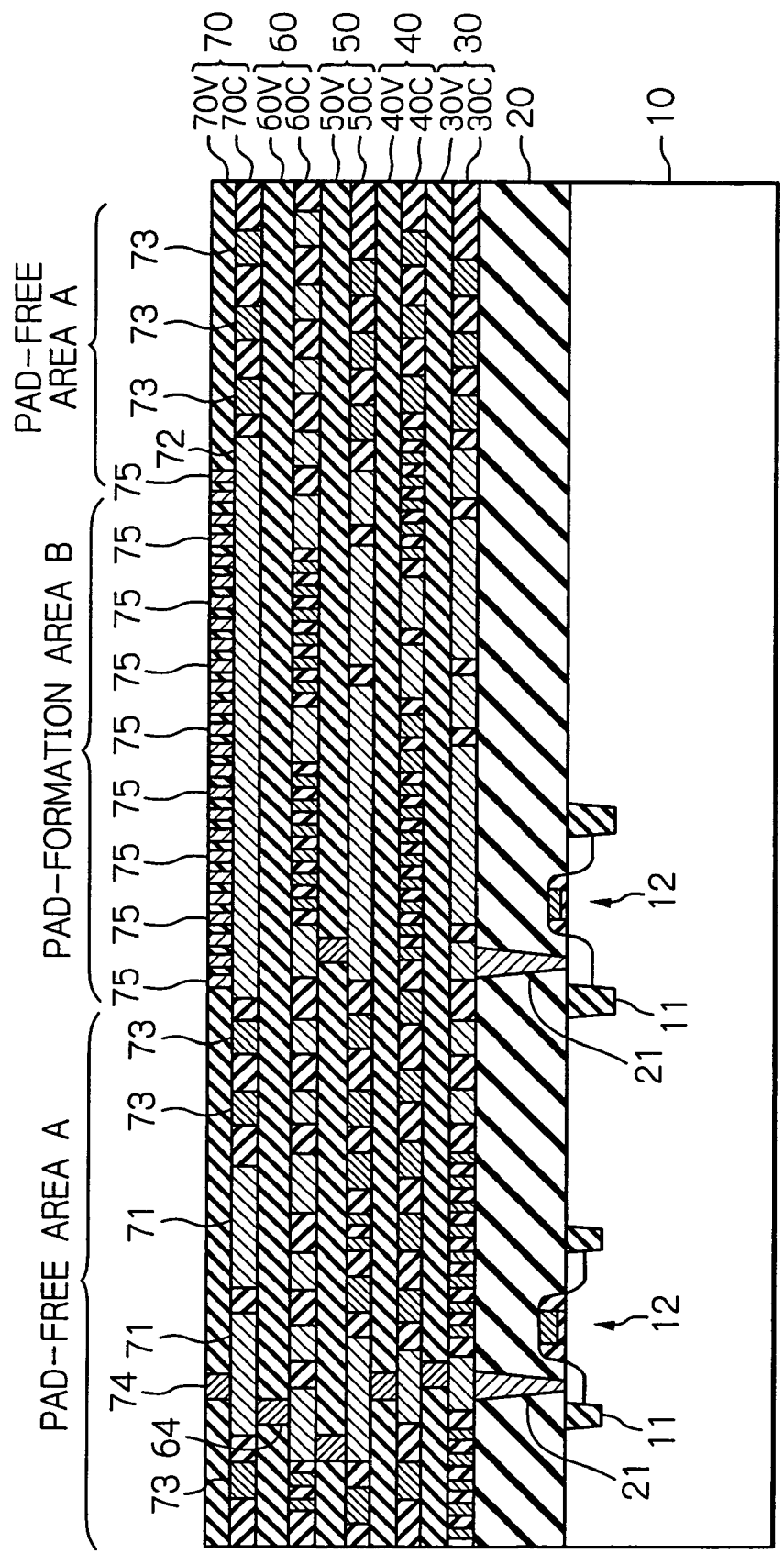

Next, referring to FIG. 2E which is a schematic partial cross-sectional view, an interconnection substructure 70 having an interconnection formation insulating interlayer 70C and a via-plug formation insulating interlayer 70V is provided on the interconnection substructure 60.

In particular, the insulating interlayer 70C is formed as a low-k layer on the insulating interlayer 60V, using a CVD process, and an interconnection pattern layer including a plurality of interconnections 71 and a plurality of electrode pads 72 is formed in the insulating interlayer 70C. Note, in FIG. 2E, only one of the electrode pads 72 is representatively illustrated. Also, in order to reinforce the insulating interlayer 70C, a reinforcement pattern layer including a plurality of reinforcing elements 73 is formed in the insulating interlayer 70C. The interconnections 71, the electrode pads 72 and the reinforcing elements 73 are composed of copper (Cu), and the formation of the interconnections 71 and the electrode pads 72 and the formation of the reinforcing elements 73 may be simultaneously carried out by using a damascene process.

As shown in FIG. 2E, one of the interconnections 71 is connected to the via plugs 64 formed in the insulating interlayer 60V.

Also, as shown in FIG. 2E, the reinforcing elements 73 included in the pad-free area A feature substantially the same small size as the reinforcing elements 32, 42, 52 and 62 included in the pad-free area A (see: FIGS. 2A through 2D).

Then, the insulating interlayer 70V is formed as a low-k layer on the insulating interlayer 70C by using a CVD process, and a via-plug pattern layer including a plurality of via plugs 74 and a plurality of small via plugs 75 is formed in the insulating interlayer 70V, with only one of the via plugs 74 being representatively illustrated. The small via plugs 75 are arranged at the pad formation area B. The via plugs 74 and 75 are composed of copper (Cu), and the formation of the plugs 74 and 75 is carried out by using a damascene process.

As shown in FIG. 2E, each of the via plugs 74 is connected to one of the interconnections 71 formed in the insulating interlayer 70C, and the small via plugs 75 are connected to the electrode pad 72 formed in the insulating interlayer 70C.

Next, referring to FIG. 2F which is a schematic partial cross-sectional view, an interconnection substructure 80 is provided as an interconnection formation insulating layer on the interconnection substructure 70. The interconnection formation insulating layer 80 is formed as a silicon dioxide layer by using a CVD process, and an interconnection pattern layer including a plurality of interconnections 81 and a plurality of electrode pads 82 is formed in the interconnection formation insulating layer 80, with only one of electrode pads 82 being representatively illustrated. Note, each of the electrode pads 82 has an extension 82E integrally formed therewith. The interconnections 81 and the electrode pads 82 are composed of copper (Cu), and the formation of the interconnections 81 and the formation of the electrode pads 82 may be simultaneously carried out by using a damascene process.

As shown in FIG. 2F, the electrode pads 82 are connected to the small via plugs 75 formed in the insulating interlayer 70V, and the extensions 82E of the electrode pads 82 are connected to the via plugs 74 formed in the insulating interlayer 70V. Note, although not illustrated, most of the interconnections 81 are suitably connected to the via plugs formed in the insulating interlayer 70V.

Next, referring to FIG. 2G which is a schematic partial cross-sectional view, a plurality of electrode pads 90, only one of which is representatively illustrated, are formed on the respective electrode pads 82 formed in the interconnection formation insulating layer 80, resulting in completion of production of the semiconductor device of FIG. 1.

Note, although the electrode pads 72 (see: FIG. 2E) and the electrode pads 82 (see: FIG. 2E) are composed of copper (Cu), the electrode pads 90 are composed of another metal material, such as aluminum (Al).

Figures 3A, 3B:
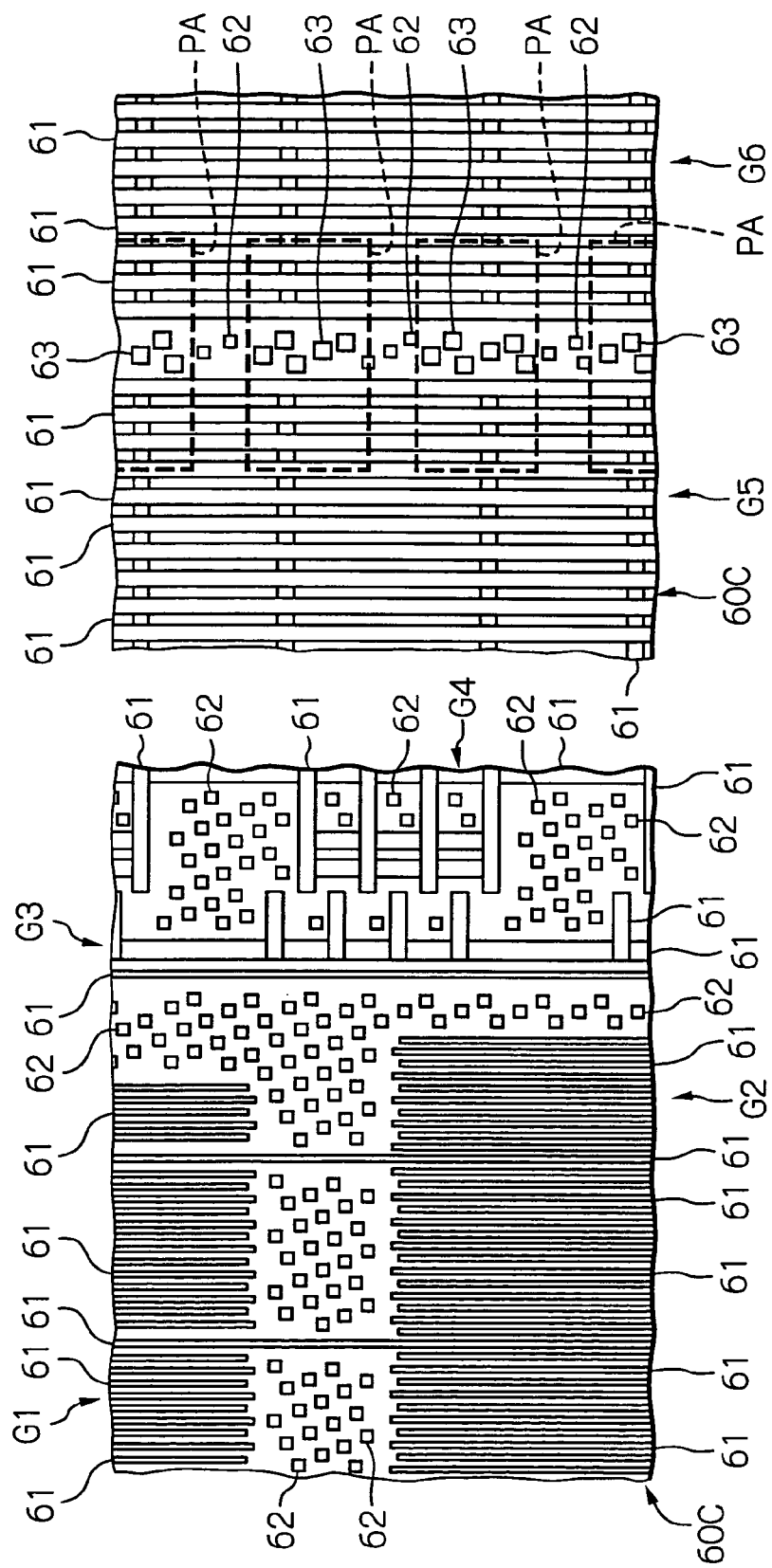
FIG. 3A is a schematic partial plan view showing a part of an interconnection formation insulating interlayer of the semiconductor structure of FIG. 1.
FIG. 3B is a schematic partial plan view showing another part of the interconnection formation insulating interlayer of the semiconductor structure of FIG. 1.

In FIG. 3A, a part of the interconnection formation insulating interlayer 60C of the interconnection substructure 60, which is included in the pad-free area A (see: FIG. 1), is shown in a plan view by way of example.

Also, in FIG. 3B, another part of the interconnection formation insulating interlayer 60C, which includes the pad formation areas B (see: FIG. 1), is shown in a plan view by way of example. In this drawing, respective pad areas PA corresponding to the pad formation areas B are defined by broken lines. Namely, the broken line defining each of the pad areas PA represents a contour of the electrode pad 90 when it is projected on the interconnection formation insulating interlayer 60C.

As shown in FIGS. 3A and 3B, the interconnections 61 are unevenly arranged and distributed over the interconnection formation insulating interlayer 60C so that groups G1, G2, G3, G4, G5 and G6 of interconnections 61 are defined.

As shown in FIG. 3A, the interconnections 61 included in the groups G1 and G2 are relatively narrow, and are used to transmit various signals. Also, the interconnections 61 included in the groups G3 and G4 are relatively wide, and are used to transmit various signals. The small reinforcing elements 62 are substantially evenly arranged and distributed in blank or interconnection-free areas among the groups G1, G2, G3 and G4, so that the interconnection formation insulating interlayer 60C is reinforced at the interconnection-free areas among the groups G1, G2, G3 and G4 by the small reinforcing elements 62.

As shown in FIG. 3B, the interconnections 61 included in the group G5 are relatively wide, and serve as power supply interconnections. Also, the interconnections 61 included in the group G6 are relatively wide, and serve as ground interconnections. The small reinforcing elements 62 and the large reinforcing elements 63 are substantially evenly arranged and distributed in a blank or interconnection-free area between the groups G5 and G6, so that the interconnection formation insulating interlayer 60C is reinforced at the interconnection-free area between the groups G5 and G6 by the small and large reinforcing elements 62 and 63. Note, all the large reinforcing elements 63 are included in the pad areas PA, and thus the pad areas PA are still further reinforced due to the existence of the large reinforcing elements 63, whereby each of the pad areas PA can be protected from being subjected to damage due to a bonding impact which is generated when a bonding wire is bonded to the corresponding electrode pad 90 (see: FIG. 1) by a wire bonding apparatus.

In general, since a total area of the pad areas PA falls within a range from several percent to ten and several percent with respect to a whole surface area of the semiconductor device, the number of the large reinforcing elements 63 is considerably smaller than that of the small reinforcing elements 62. Accordingly, it is possible to minimize a fluctuation of the optimum conditions of an etching process for forming the interconnections 61 and the small and large reinforcing elements 62 and 63 in the interconnection formation insulating interlayer 60C.

The small and large reinforcing elements 62 and 63 are electrically isolated from the interconnections 61 and the electrode pads 90 (see: FIGS. 1 and 2G). Namely, the small and large reinforcing elements 62 and 63 are electrically floated. Thus, when each of the reinforcing elements 62 and 63 is accidentally and electrically charged, and when the charged reinforcing element is placed beside one of the signal transmission interconnections 61 (see: FIG. 3A), resulting in an influence on signal propagation in the signal transmission interconnection due to parasitic capacitance produced between the charged reinforcing element and the signal transmission interconnection, the larger the size of the charged reinforcing element is, the larger the influence on the signal propagation in the signal transmission interconnection is.

Thus, it is preferable that the small reinforcing elements 62 are arranged over the interconnection-free areas between the groups G1, G2, G3 and G4 of signal transmission interconnections 61 (see: FIG. 3A), and that the large reinforcing elements 63 are arranged beside the power supply interconnections and the ground interconnections (see: FIG. 3B).

FIG. 4 shows an interconnection/reinforcement pattern design apparatus, generally indicated by reference numeral 100, to automatically carry out a design of both the interconnection pattern and the reinforcement pattern to be formed on each of the interconnection formation insulating interlayers 30C, 40C, 50C and 60C.

The interconnection/reinforcement pattern design apparatus 100 includes a system control unit 101 which contains a microcomputer comprising a central processing unit (CPU), a read-only memory (ROM) for storing various programs and constants, a random-access memory (RAM) for storing temporary data, and an input/output (I/O) interface circuit.

The interconnection/reinforcement pattern design apparatus 100 also includes a display unit 102, such as a cathode ray tube (CRT), a liquid crystal display (LCD) or the like, for displaying interconnection patterns and reinforcing patterns together with command items, and a keyboard 103 for inputting various commands and data, to the system control unit 101 though the I/O interface circuit thereof.

Also, the interconnection/reinforcement pattern design apparatus 100 is provided with a mouse 104, which may be used to input a command to the system control unit 100 by clicking the mouse 104 on any one of the command items displayed on the display unit 102.

The interconnection/reinforcement pattern design apparatus 100 further includes a hard disk drive 105 for driving a hard disk 106 on which a pattern design program, other programs and so on are stored. The system control unit 101 writes the programs and the various data on the hard disk 106 through the hard disk drive 105, and also reads the various data from the hard disk 106 through the hard disk drive 105.

Figure 5:
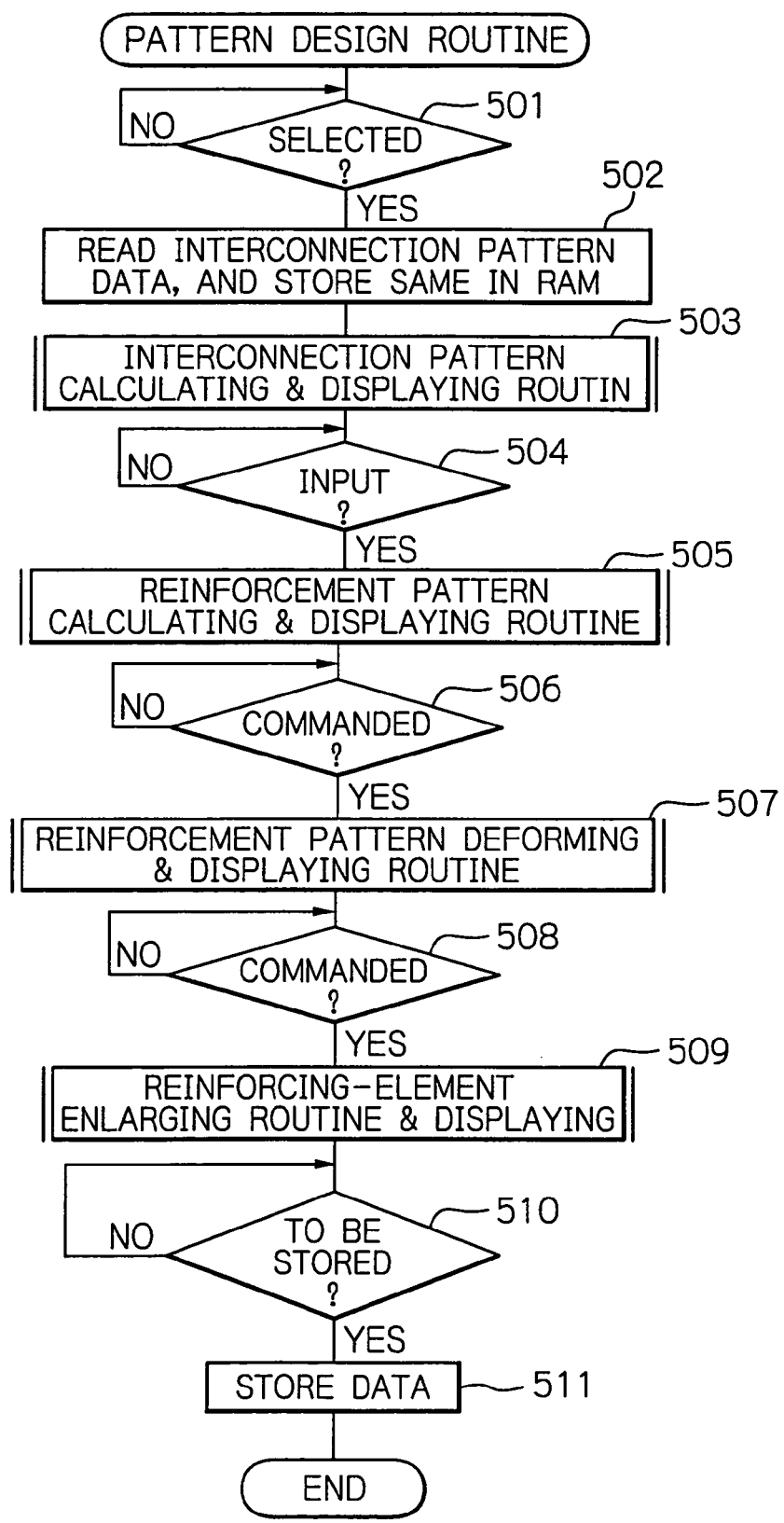
FIG. 5 is a flowchart of a pattern design routine executed in the interconnection/reinforcement pattern design apparatus of FIG. 4.

FIG. 5 shows a flowchart of a pattern design routine which is executed in the system control unit 101 of FIG. 4 to automatically carry out a design of both the interconnection pattern and the reinforcement pattern to be formed in each of the interconnection formation insulating interlayers 30C, 40C, 50C and 60C.

Note, the pattern design routine forms a part of a main design routine for designing a semiconductor device as shown in FIG. 1. Also, note, first, second, third and fourth_interconnection pattern data, which correspond to the respective interconnection patterns to be formed in the interconnection formation insulating interlayers_30C, 40C, 50C and 60C, are previously prepared and stored on the hard disk 106.

At step 501, it is monitored to determine whether any one of the first, second, third and fourth interconnection pattern data is selected by operating either the keyboard 103 or the mouse 104. For example, when it is confirmed that the fourth interconnection pattern data, which corresponds to the interconnection pattern to be formed on the interconnection formation insulating interlayer 60C, has been selected, the control proceeds to step 502, in which the fourth interconnection pattern data is read from the hard disk 106 through the hard disk driver 105, and is stored in the RAM of the system control unit 101.

Figure 6A:
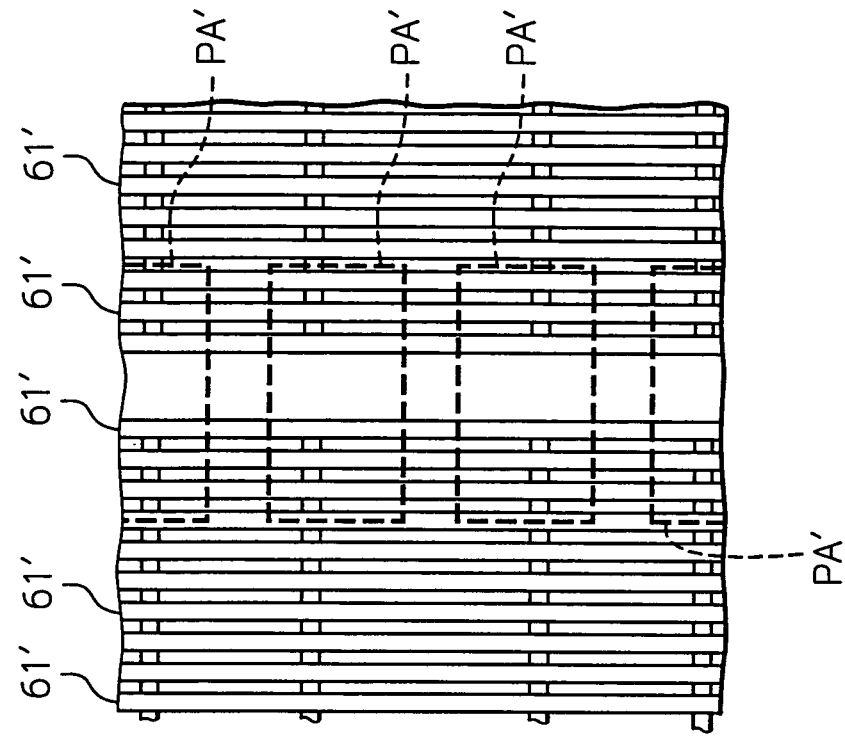
FIGS. 6A and 6B are explanatory views corresponding to FIGS. 3A and 3B for explaining step 503 of FIG. 5.
Figure 6B:
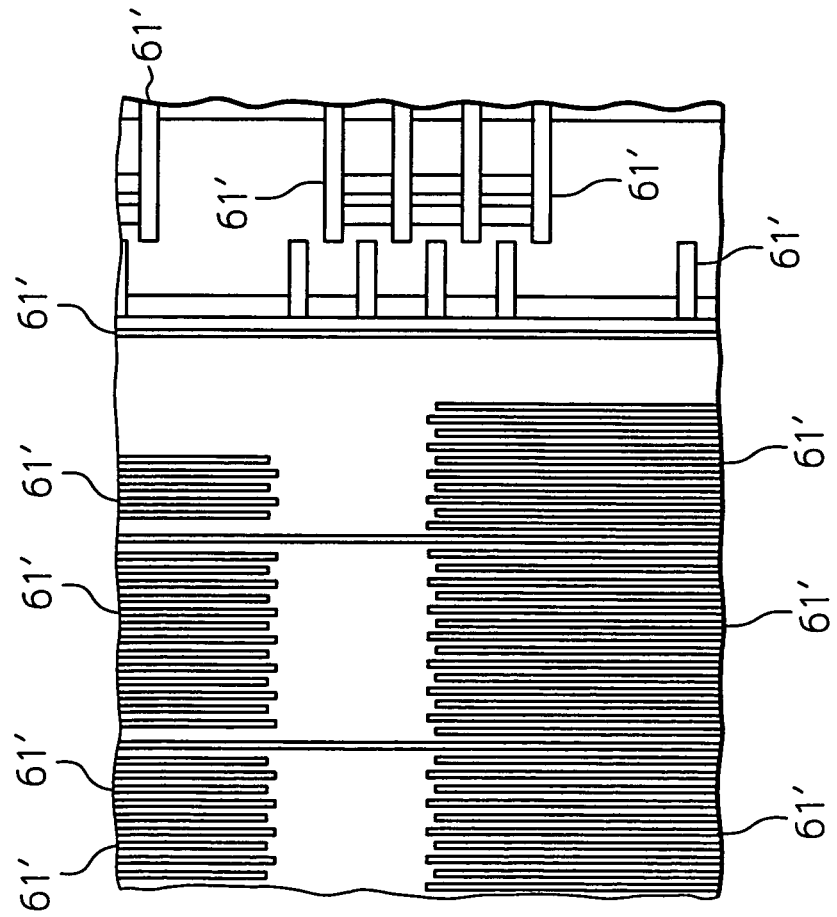

At step 503, an interconnection pattern calculating and displaying routine is executed so that an interconnection pattern is calculated and displayed on the screen of the display unit 102 based on the read fourth interconnection pattern data, as shown in FIGS. 6A and 6B by way of example. Note, the interconnection pattern includes a plurality of interconnections 61' which correspond to the interconnections 61 as shown in FIGS. 3A and 3B. Also, note, in FIG. 6B, pad areas corresponding to the pad areas PA shown in FIG. 3B are indicated by reference PA'.

Figure 7B:
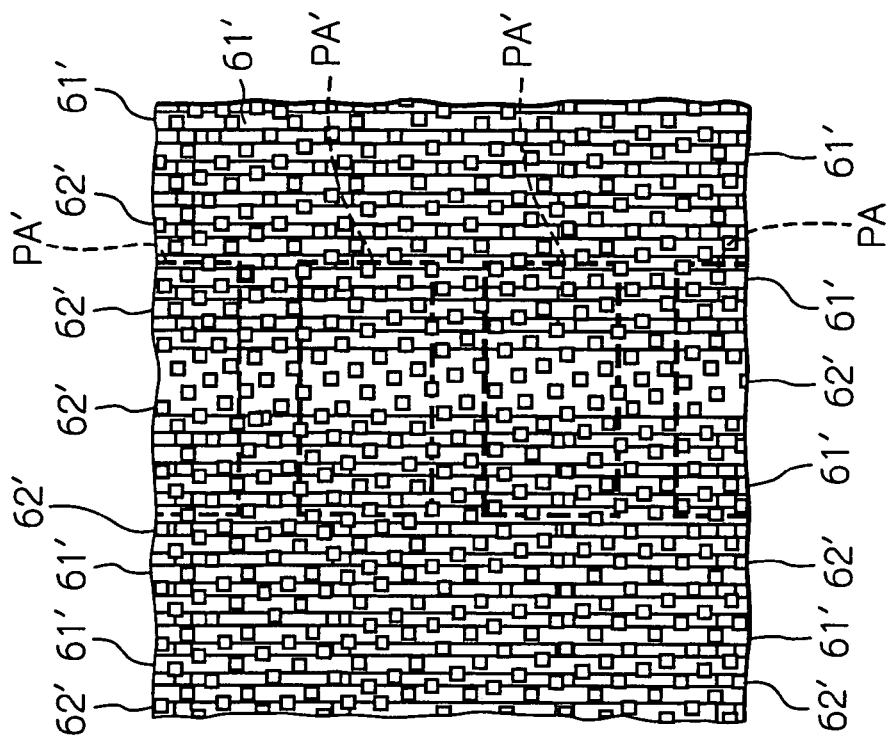
FIGS. 7A and 7B are explanatory views corresponding to FIGS. 3A and 3B for explaining step 505 of FIG. 5.
Figure 7A:
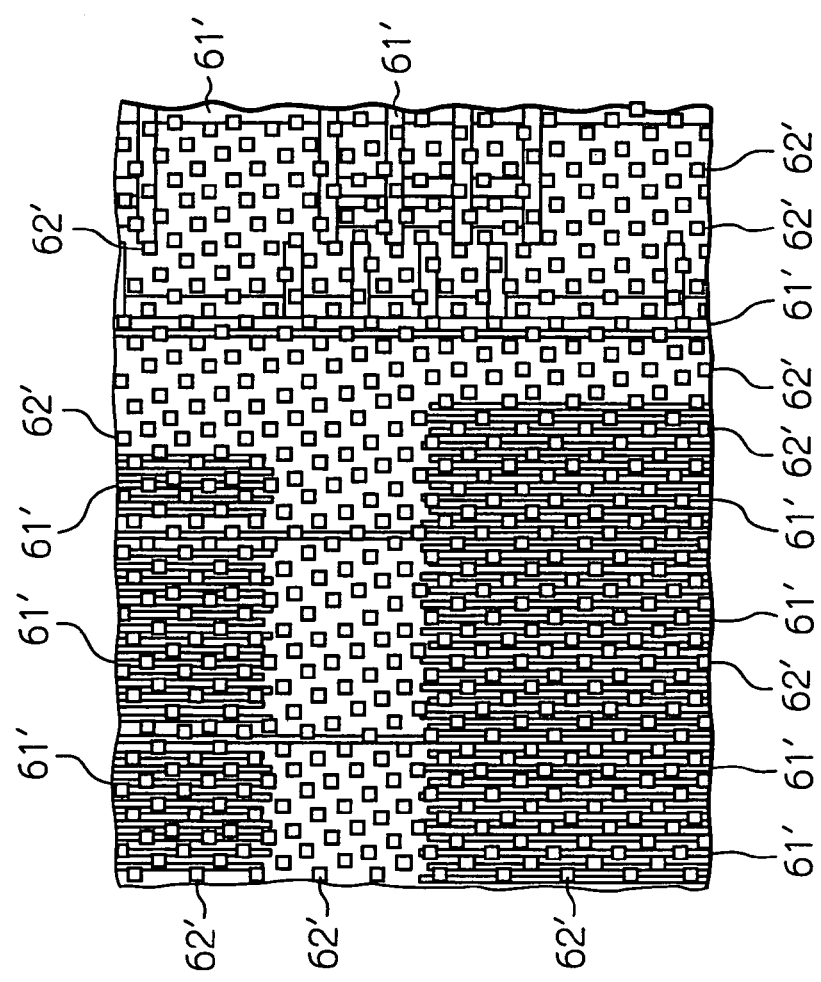

At step 504, it is monitored to determine whether size data and pitch data of reinforcing elements to be calculated and displayed on the screen of the display unit 102 are input to the system control unit 101 by operating either the keyboard 103 or the mouse 104. When the inputting of the size data and the pitch data to the system control unit 101 is confirmed, the control proceeds to step 505, in which a reinforcement pattern calculating and displaying routine is executed so that a reinforcement pattern including a plurality of reinforcing elements 62' is calculated and displayed on the screen of the display unit 102, as shown in FIGS. 7A and 7B by way of example.

Each of the reinforcing elements 62' has a size based on the aforesaid size data, and the reinforcing elements 62' are evenly arranged and distributed at a pitch based on the aforesaid pitch data. Note, each of the reinforcing elements 62' corresponds to the small reinforcing element 62 as shown in FIGS. 3A and 3B.

At step 506, it is monitored to determine whether an execution of a reinforcement pattern deforming and displaying routine is commanded by operating either keyboard 103 or the mouse 104. When it is confirmed that the execution of the reinforcement pattern deforming and displaying routine has been commanded, the control proceeds to step 507, in which the reinforcement pattern deforming and displaying routine is executed.

Figure 8A:
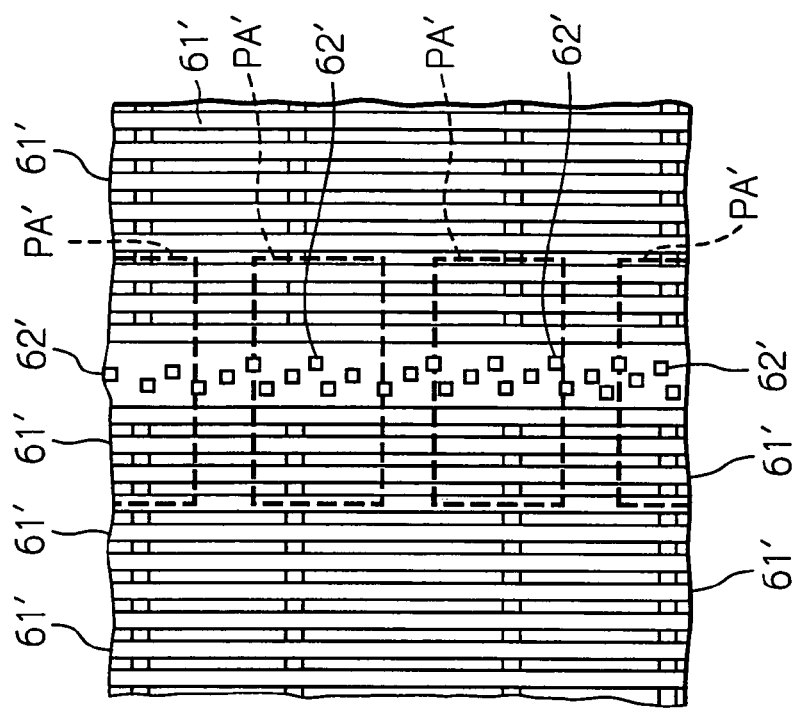
FIGS. 8A and 8B are explanatory views corresponding to FIGS. 3A and 3B for explaining step 507 of FIG. 5.
Figure 8B:
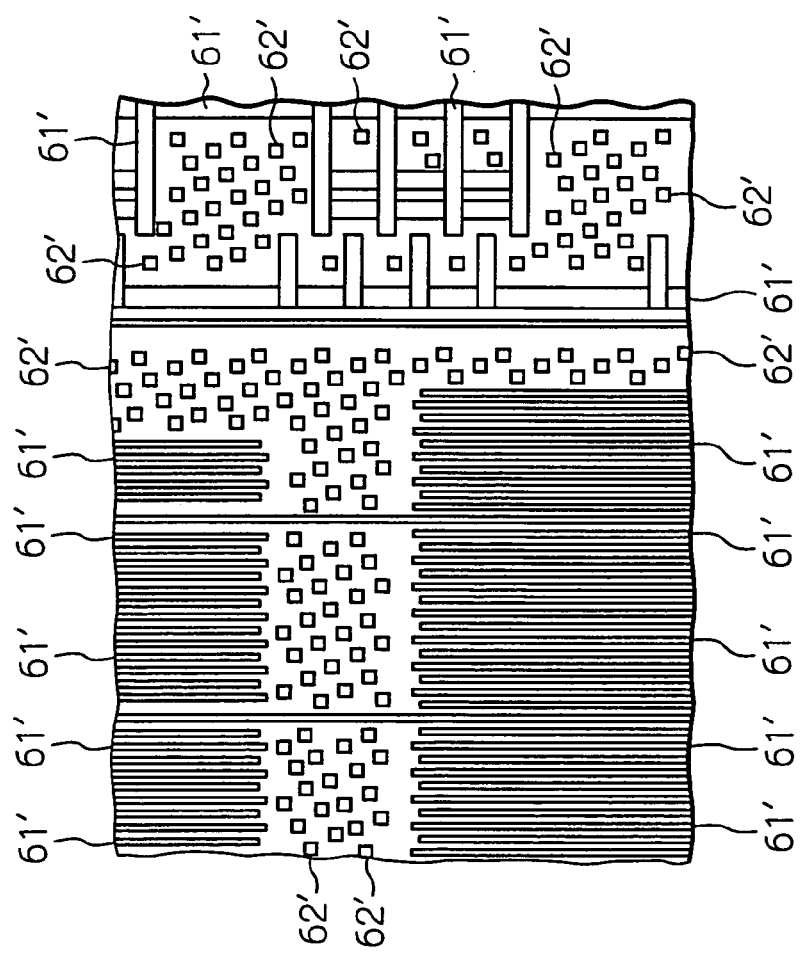

In the execution of the reinforcement pattern deforming and displaying routine, the reinforcement pattern is deformed so that a part of the reinforcing elements 62', which overlaps with the interconnections 61', and another part of the reinforcing elements 62', which is too close to the interconnections 61', are eliminated from the reinforcement pattern, and then the deformed reinforcement pattern is displayed on the screen of the display unit 102, as shown in FIGS. 8A and 8B by way of example. Namely, the reinforcement pattern shown in FIGS. 7A and 7B is deformed into that shown in FIGS. 8A and 8B.

At step 508, it is monitored to determine whether an execution of a reinforcing-element enlarging and displaying routine is commanded by operating either the keyboard 103 or the mouse 104. When it is confirmed that the execution of the reinforcing-element enlarging and displaying routine has been commanded, the control proceeds to step 509, in which the reinforcing-element enlarging and displaying routine is executed.

In the execution of the reinforcing-element enlarging and displaying routine, a part of the reinforcing elements 62' (see: FIG. 8B), which is included in the pad areas PA', is enlarged and displayed as large reinforcing elements 63', as shown in FIGS. 9A and 9B by way of example.

Note, the enlarged reinforcing elements 63' correspond to the large reinforcing elements 63 shown in FIG. 3B.

At step 510, it is monitored to determine whether a storage of both the interconnection pattern including the interconnections 61' and the reinforcement pattern including the small and large reinforcing elements 62' and 63' on the hard disk 106 is demanded by operating either the keyboard 103 or the mouse 104. When it is confirmed that the storage of both the interconnection pattern and the reinforcement pattern on the hard disk 106 has been demanded, the control proceeds to step 511, in which both the interconnection pattern and the reinforcement pattern are stored in the hard disk 106 through the hard disk drive 105 as photomask pattern data for forming the interconnections 61 and the reinforcing elements 62 and 63 in the interconnection formation insulating interlayer 60C.

Finally, it will be understood by those skilled in the art that the foregoing description is of preferred embodiments of the devices and methods, and that various changes and modifications may be made to the present invention without departing from the spirit and scope thereof.

The invention claimed is:

1. A semiconductor device, comprising:
a wire-bonding electrode pad;
a plurality of interconnection formation insulating interlayers provided beneath said wire-bonding electrode pad;
a plurality of wire-bonding electrode pad interconnections provided within said plurality of interconnection formation insulating interlayers;
a first reinforcing element provided beneath said wire-bonding electrode pad and among said plurality of wire-bonding electrode pad interconnections; and
a second reinforcing element provided among said plurality of wire-bonding electrode pad interconnections,
wherein said first reinforcing element has a larger size than that of the second reinforcing element.

2. The semiconductor device as set forth in claim 1, further comprising an insulating layer in which said first reinforcing element and said second reinforcing element are formed.

3. The semiconductor device as set forth in claim 2, wherein said interconnections are formed in said insulating interlayer.

4. The semiconductor device as set forth in claim 3, wherein said second reinforcing element is formed in said insulating layer except for a pad area above which said wire-bonding electrode pad is provided.

5. The semiconductor device as set forth in claim 4, wherein at least one of said interconnections is arranged beneath said wire-bonding electrode pad.

6. The semiconductor device as set forth in claim 5, wherein said at least one of said interconnections is defined as one of a power supply interconnection and a ground interconnection.

7. The semiconductor device as set forth in claim 6, wherein said wire-bonding electrode pad is electrically isolated from said first reinforcing element.

8. The semiconductor device as set forth in claim 7, wherein said wire-bonding electrode pad is composed of aluminum as a main component, and wherein said interconnections, said first reinforcing element and said second reinforcing element are composed of copper as respective main components.

9. A semiconductor device, comprising:
an interconnection formation insulating interlayer;
a plurality of interconnections formed in said interconnection formation insulating interlayer;
a wire-bonding electrode pad provided above said interconnection formation insulating interlayer so that a pad area, on which said wire-bonding electrode pad is projected, is defined on said interconnection formation insulating interlayer; and
a plurality of reinforcing elements substantially evenly formed in blank areas of said interconnection insulating interlayer in which no interconnection of said plurality of interconnections to said wire-bonding electrode pad is formed,
wherein a part of said reinforcing elements included in said pad area features a larger size than that of the remaining reinforcing elements.

10. The semiconductor device as set forth in claim 9, wherein said interconnection formation insulating interlayer is defined as an insulating interlayer exhibiting a smaller dielectric constant than that of silicon dioxide.

11. The semiconductor device as set forth in claim 9, wherein said wire-bonding electrode pad is composed of aluminum, and wherein said interconnections and said reinforcing elements are composed of copper.

12. The semiconductor device as set forth in claim 9, wherein at least one of said interconnections is arranged so as to extend through said pad area.

13. The semiconductor device as set forth in claim 12, wherein said at least one of said interconnections is defined as one of a power supply interconnection and a ground interconnection.

* * * * *